(12) United States Patent
Yeung et al.

(10) Patent No.: US 9,762,287 B2
(45) Date of Patent: Sep. 12, 2017

(54) CROSSTALK REDUCTION IN MULTIPLEXERS

(71) Applicant: Pericom Semiconductor Corporation, Milpitas, CA (US)

(72) Inventors: Tony Yeung, Milpitas, CA (US); Michael Y. Zhang, Palo Alto, CA (US)

(73) Assignee: Pericom Semiconductor Corporation, Milpitas, CA (US)

( * ) Notice: Subject to any disclaimer, the term of this patent is extended or adjusted under 35 U.S.C. 154(b) by 53 days.

(21) Appl. No.: 14/727,604

(22) Filed: Jun. 1, 2015

(65) Prior Publication Data
US 2016/0352387 A1    Dec. 1, 2016

(51) Int. Cl.
*H04B 3/32*    (2006.01)
*H03K 5/135*   (2006.01)

(52) U.S. Cl.
CPC ............... *H04B 3/32* (2013.01); *H03K 5/135* (2013.01)

(58) Field of Classification Search
CPC ... H04L 25/03057; H04L 25/03; H04L 25/00; H04L 1/0001; H04L 1/0083; H04J 14/02; H04B 3/32

USPC ........................................................ 370/201
See application file for complete search history.

(56) References Cited

U.S. PATENT DOCUMENTS

| | | | |
|---|---|---|---|
| 4,056,686 A | 11/1977 | Zielinski | |
| 5,777,505 A * | 7/1998 | LaRue | H03K 17/693 327/407 |
| 6,046,638 A * | 4/2000 | Hogeboom | H03K 5/2481 330/252 |
| 6,369,637 B1 * | 4/2002 | Kiriaki | H03K 17/6257 257/276 |
| 2005/0014476 A1 * | 1/2005 | Oono | H03C 3/40 455/118 |
| 2010/0111327 A1 * | 5/2010 | Lontka | G08B 17/00 381/97 |
| 2011/0273431 A1 * | 11/2011 | Ando | H03K 17/005 345/212 |

* cited by examiner

*Primary Examiner* — Chi H Pham
*Assistant Examiner* — Alexander O Boakye
(74) *Attorney, Agent, or Firm* — Weaver Austin Villeneuve & Sampson LLP (57) ABSTRACT

Multiplexers are described in which differential signals on the signal paths associated with unselected differential inputs are converted to common mode signals to reduce crosstalk between unselected signal paths and the multiplexer's active signal path.

28 Claims, 7 Drawing Sheets

Coupling from disabled differential multiplexer input to differential multiplexer output

CROSSTALK REDUCTION IN MULTIPLEXERS

BACKGROUND

A multiplexer is a device that selects from among multiple input signals received at its inputs and transmits the selected input signal on the multiplexer output. Multiplexers find utility, for example, in the context of serial data links, enabling multiple devices to alternately use the same serial data path. Conventional multiplexers typically place unselected inputs in a high impedance state. However, such an approach is not sufficient to isolate the multiplexer's output from its unselected inputs as data rates increase.

Figure 1:
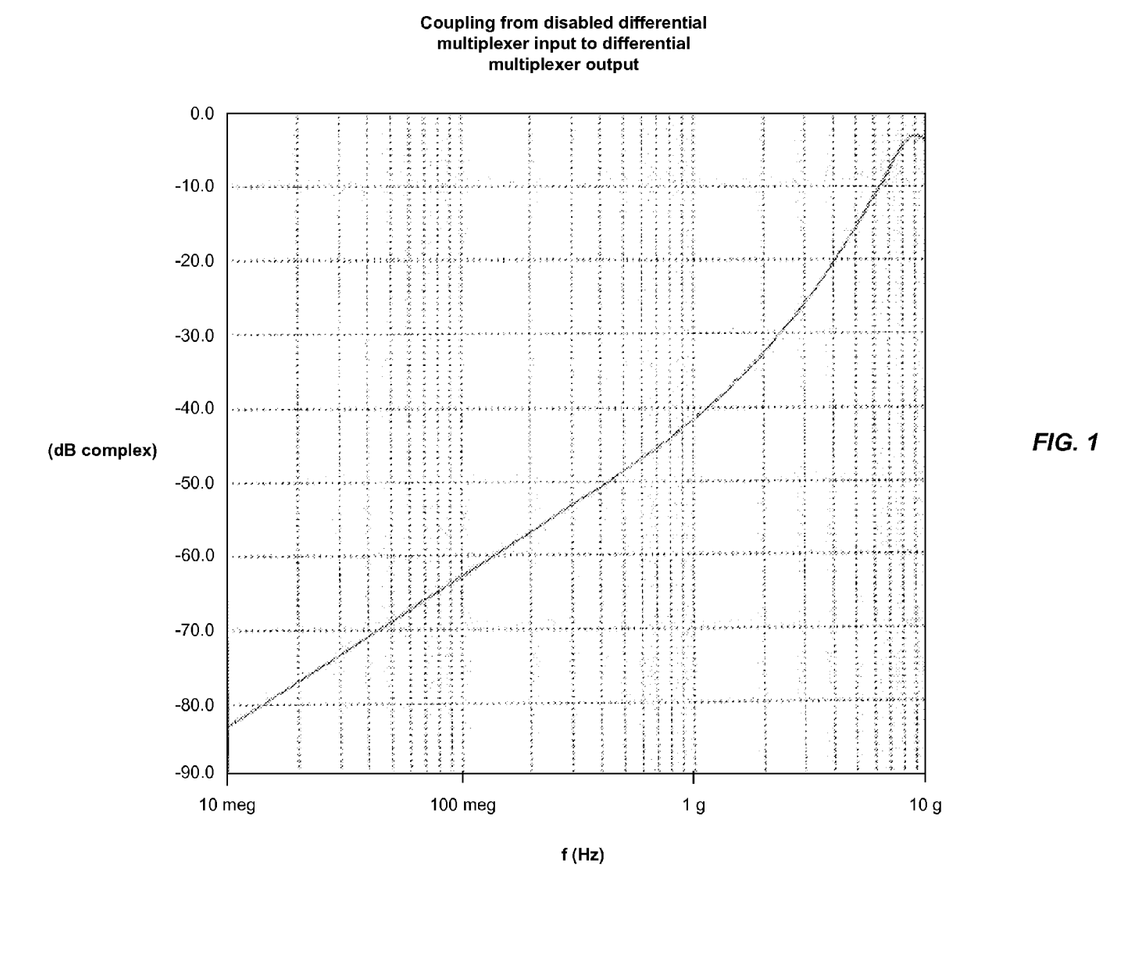
FIG. 1 is a graph illustrating crosstalk from an unselected input of a multiplexer to the multiplexer output.

At high data rates (e.g., above several hundred MHz), parasitic capacitances in a multiplexer increasingly promote interference between signal paths, resulting in "crosstalk" between the signal paths of the unselected inputs and the signal path of the active input; with resulting interference at the multiplexer output. This may be understood with reference to the graph of FIG. 1 in which coupling from an unselected differential input of a multiplexer to the multiplexer's differential output is illustrated. As shown in the graph, the coupling or crosstalk becomes unacceptably high as the data rate approaches 10 GHz.

One approach to handling such crosstalk might be to insert additional circuitry in the input signal paths before they merge to increase the isolation between unselected multiplexer inputs. However, such an approach is likely to negatively affect signal integrity as well as latency; particularly for high data rate applications.

SUMMARY

According to various implementations, crosstalk between unselected multiplexer inputs and the multiplexer output is mitigated by converting differential signals associated with the unselected differential inputs to common mode signals.

According to a particular class of implementations, a multiplexer includes a plurality of multiplexer inputs, each of which is a differential input, and a multiplexer output. The multiplexer includes selection circuitry configured to enable an active signal path from a selected one of the multiplexer inputs to the multiplexer output. The selection circuitry is also configured to disable unselected signal paths corresponding to unselected ones of the multiplexer inputs. The multiplexer includes conversion circuitry configured to convert, for each of the unselected signal paths, a corresponding differential signal to a common mode signal. According to various of these implementations, the multiplexer may be an active multiplexer or a passive multiplexer.

According to a specific implementation, the conversion circuitry includes a plurality of switches. Each of the switches is configured to convert the differential signal for a corresponding one of the unselected signal paths by connecting complementary circuit nodes of the corresponding unselected signal path. According to a more specific implementation, each of the multiplexer inputs has an inverting node and a non-inverting node, and the complementary circuit nodes of each unselected signal path correspond to the inverting and non-inverting nodes of the corresponding multiplexer input. According to an alternative implementation, the complementary circuit nodes of each unselected signal path correspond to internal circuit nodes of the multiplexer subsequent to the inverting and non-inverting nodes of the corresponding multiplexer input and before the selection circuitry.

According to a specific implementation, the multiplexer includes a plurality of isolation circuits. Each isolation circuit is associated with a corresponding one of the signal paths and is configured to isolate the corresponding multiplexer input from the common mode signal.

According to a specific implementation, the conversion circuitry includes a plurality of active devices. Each of the active devices has a high input impedance and is configured to convert the differential signal for a corresponding one of the unselected signal paths by combining complementary signals on complementary circuit nodes of the corresponding unselected signal path. According to some of these implementations, each of the active devices is an analog amplifier configured to be bypassed or disabled when the corresponding multiplexer input is the selected multiplexer input. According to a more specific implementation, each of the multiplexer inputs has an inverting node and a non-inverting node, and the complementary circuit nodes of each unselected signal path correspond to the inverting and non-inverting nodes of the corresponding multiplexer input. According to an alternative implementation, the complementary circuit nodes of each unselected signal path correspond to internal circuit nodes of the multiplexer subsequent to the inverting and non-inverting nodes of the corresponding multiplexer input and before the selection circuitry.

A further understanding of the nature and advantages of various implementations may be realized by reference to the remaining portions of the specification and the drawings.

DETAILED DESCRIPTION

Reference will now be made in detail to specific implementations. Examples of these implementations are illustrated in the accompanying drawings. It should be noted that these examples are described for illustrative purposes and are not intended to limit the scope of this disclosure. Rather, alternatives, modifications, and equivalents of the described implementations are included within the scope of this disclosure as defined by the appended claims. In addition, specific details may be provided in order to promote a thorough understanding of the described implementations. Some implementations within the scope of this disclosure may be practiced without some or all of these details. Further, well known features may not have been described in detail for the sake of clarity.

According to various implementations, crosstalk between unselected multiplexer inputs and the multiplexer output is mitigated by converting the differential signals on the signal paths associated with the unselected differential inputs to common mode signals. Interference from these common mode signals may then be more effectively rejected by the differential circuitry of the active signal path. It should be noted that the techniques enabled by the present disclosure are applicable to both active and passive multiplexers.

Figure 2:
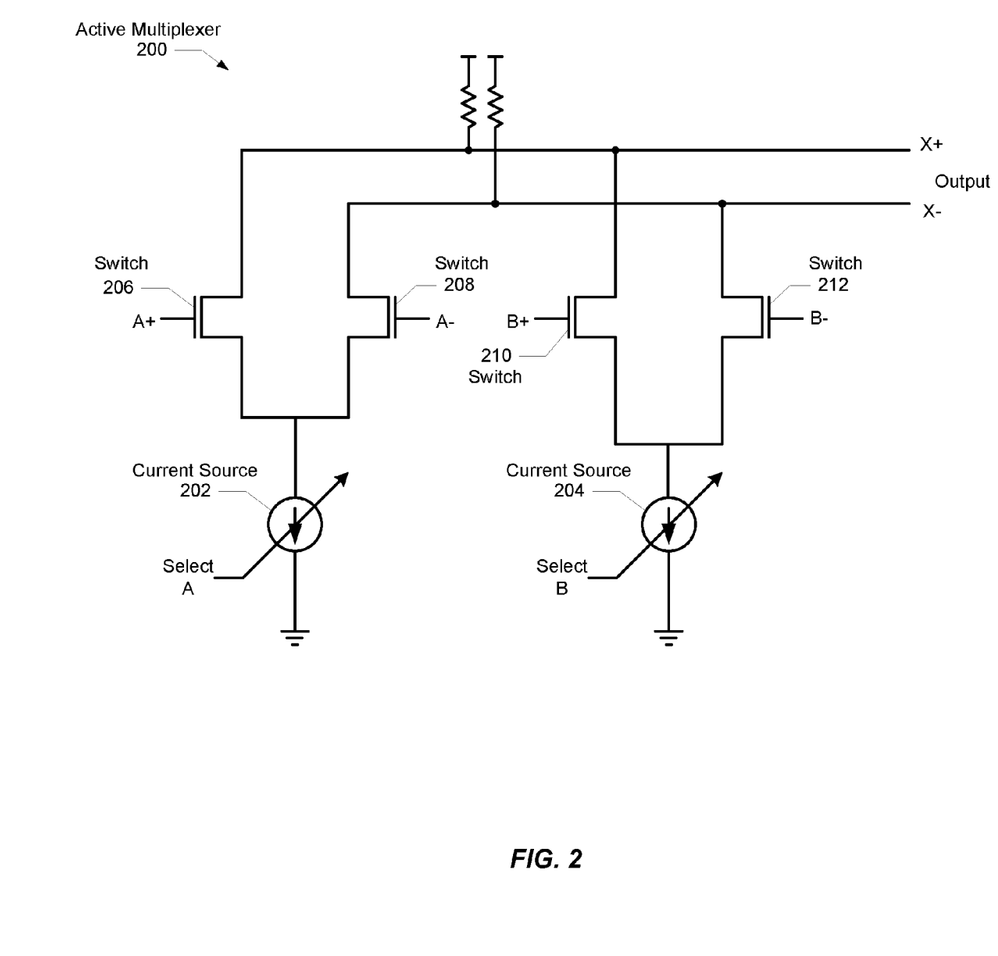
FIG. 2 is a simplified schematic of an active multiplexer.

FIG. 2 is a simplified schematic diagram of an active multiplexer 200 having two differential inputs represented by respective pairs of non-inverting and inverting input nodes; i.e., differential input A by A+ and A−, and differential input B by B+ and B−. An active signal path is enabled between the selected input and the multiplexer's differential output (represented by nodes X+ and X−) by the activation of the corresponding selection circuitry that includes current sources 202 and 204. That is, for example, the differential signal on differential input A is routed to the differential output via switches 206 and 208 when current source 202 is enabled. When differential input A is selected, the signal path from unselected differential input B is disabled by disabling current source 204, with the result that any differential signal on input B is presented with the high impedance at the inputs of switches 210 and 212 in their off states. As discussed above, for lower data rates, this impedance is sufficiently high to isolate the signal on input B from the multiplexer's output.

Figure 3:
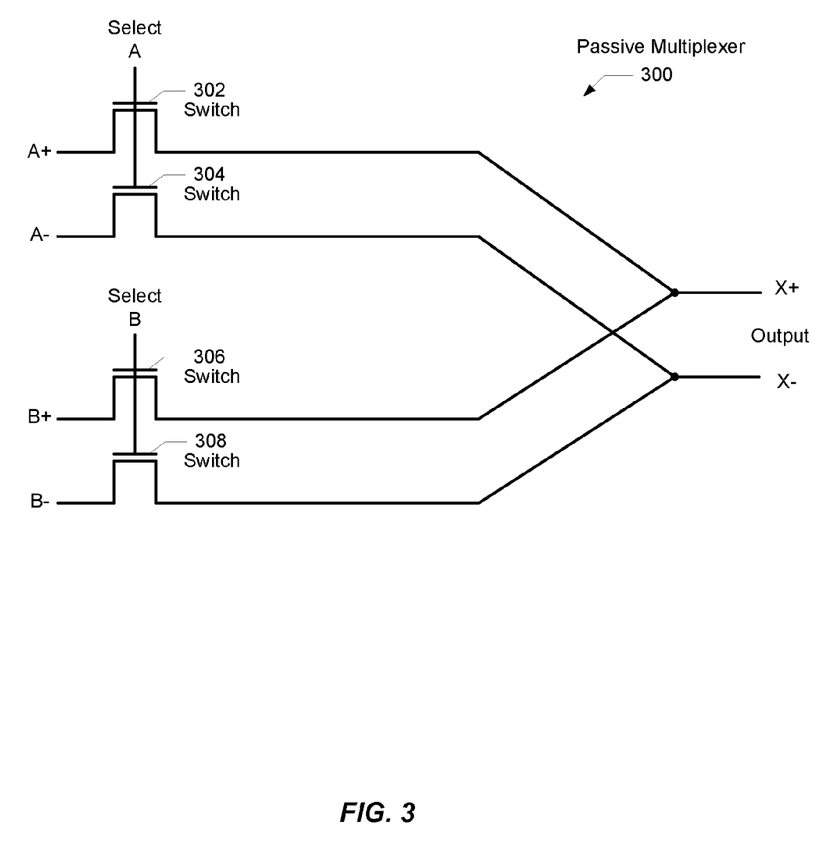
FIG. 3 is a simplified schematic of a passive multiplexer.

FIG. 3 is a simplified schematic diagram of a passive multiplexer 300 having two differential inputs A and B in which the differential signals on the respective inputs are routed to the multiplexer output X via activation of the corresponding pair of switches (i.e., switches 302 and 304 for input A, and switches 306 and 308 for input B). As mentioned above with respect to the active multiplexer of FIG. 2, isolation of the signal on the unselected input from the multiplexer output is provided by the impedance of the input switches (302-308) in their off states. However, as data rates increase for both active and passive multiplexers, the parasitic capacitances of the devices (represented by Cp in both FIGS. 2 and 3) increasingly dominate the impedance of the input switches, providing a relatively low-impedance path from the signal paths of the unselected inputs to the active signal path.

According to a particular class of implementations, the differential signals on the signal paths associated with the unselected multiplexer inputs are converted to common mode signals using a switch for each signal path that effectively shorts the complementary signals of the signal path (i.e., through the switch) when the corresponding input is not selected. This may be understood with reference to multiplexer 400 of FIG. 4 in which switches 402 and 404 are provided between the inverting and non-inverting input nodes of differential inputs A and B, respectively. When input A is selected as the active multiplexer input, switch 404 is turned on, connecting inverting node B− to non-inverting node B+ thereby converting the differential signal on input B to a common mode signal. The differential circuitry of the subsequent multiplexer circuitry then rejects this common mode signal (which may still reach the active signal path via parasitic capacitances) in much the same way as it rejects any common mode signal associated with the active signal path.

Figure 4:
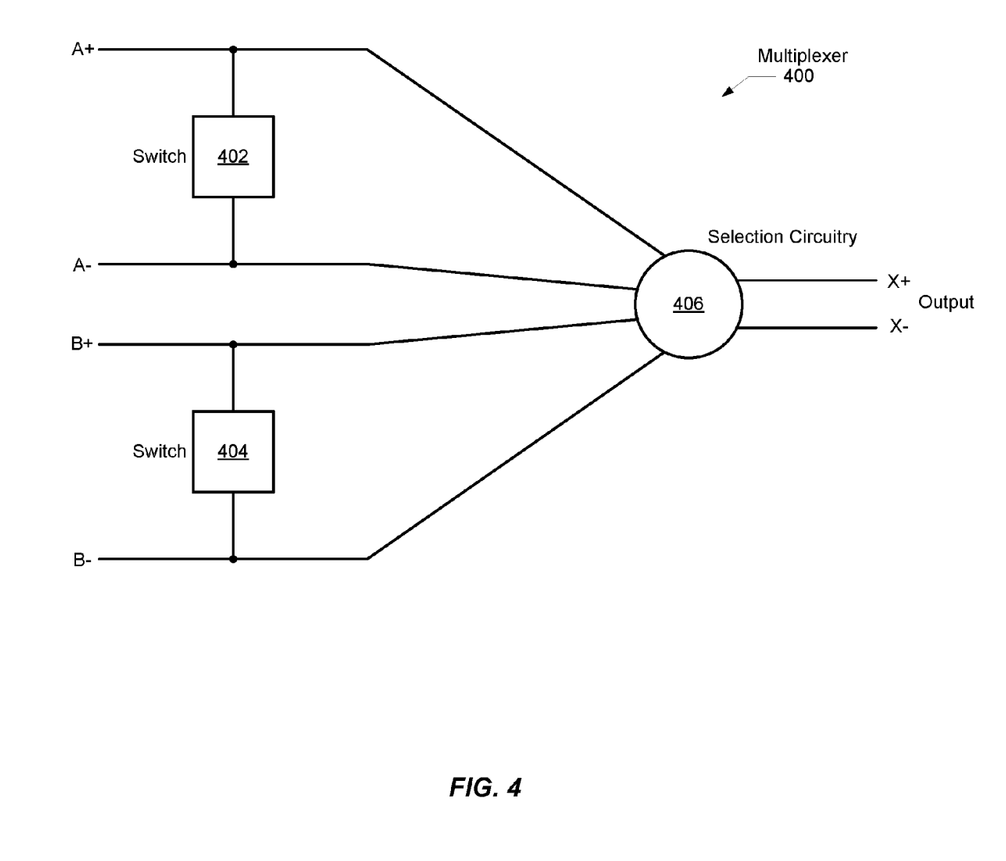
FIG. 4 is a simplified diagram of a portion of a multiplexer according to a particular implementation.

As will be appreciated, the techniques described herein may be employed with both active and passive multiplexers, e.g., multiplexer selection circuitry 406 may be implemented using the circuitry of multiplexers 200 and 300 of FIGS. 2 and 3. Further, the manner in which the conversion circuitry in each signal path is enabled and/or disabled may leverage the circuitry used to select the active signal path and/or disable the unselected signal paths.

Figure 5:
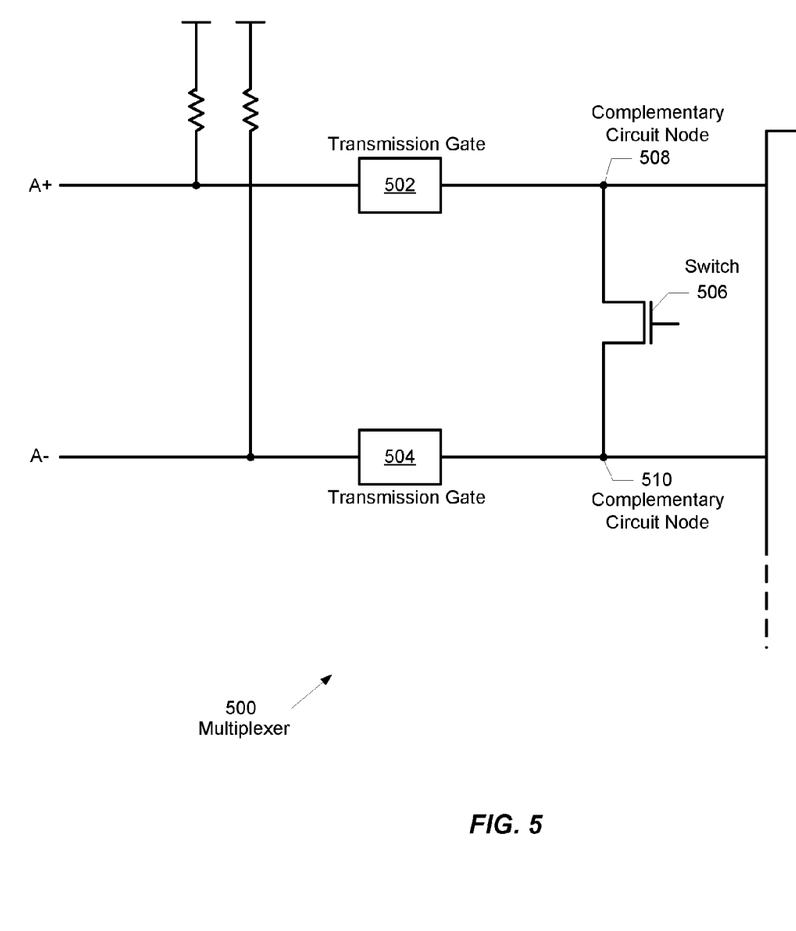
FIG. 5 is a simplified diagram of a multiplexer according to another implementation.

For some applications, it may be desirable to ensure that the impedance presented by each multiplexer input to the upstream signal path is not significantly affected or disturbed by the conversion of the differential signals on unselected signal paths. This may be understood with reference to the example of FIG. 5 in which the complementary nodes of each of the differential inputs of multiplexer 500 is terminated with a terminating impedance (e.g., 50 ohm termination) to match the impedance of the upstream transmission lines (not shown). Only one input (input A) and a portion of multiplexer 500 is shown for clarity. In the depicted implementation, isolation circuitry is provided for each of the multiplexer inputs in the form of transmission gates 502 and 504 (which may be active or passive devices) which pass the input signal to the selection circuitry when the corresponding multiplexer input is the selected input. However, when the corresponding input is not selected, gates 502 and 504 isolate the input from the selection circuitry. This allows switch 506 to be activated and complementary circuit nodes 508 and 510 connected (with the effect described above) without significantly affecting the impedance presented by the multiplexer input. As will be appreciated, the isolation provided by gates 502 and 504 are particularly useful for implementations in which the complementary nodes of the unselected signal path that are being effectively shorted together are the inverting and non-inverting nodes of the multiplexer input itself. However, it should be noted that implementations are contemplated in which the conversion of the differential signals of unselected signal paths to common mode signals occurs at internal nodes of the multiplexer.

Figure 6:
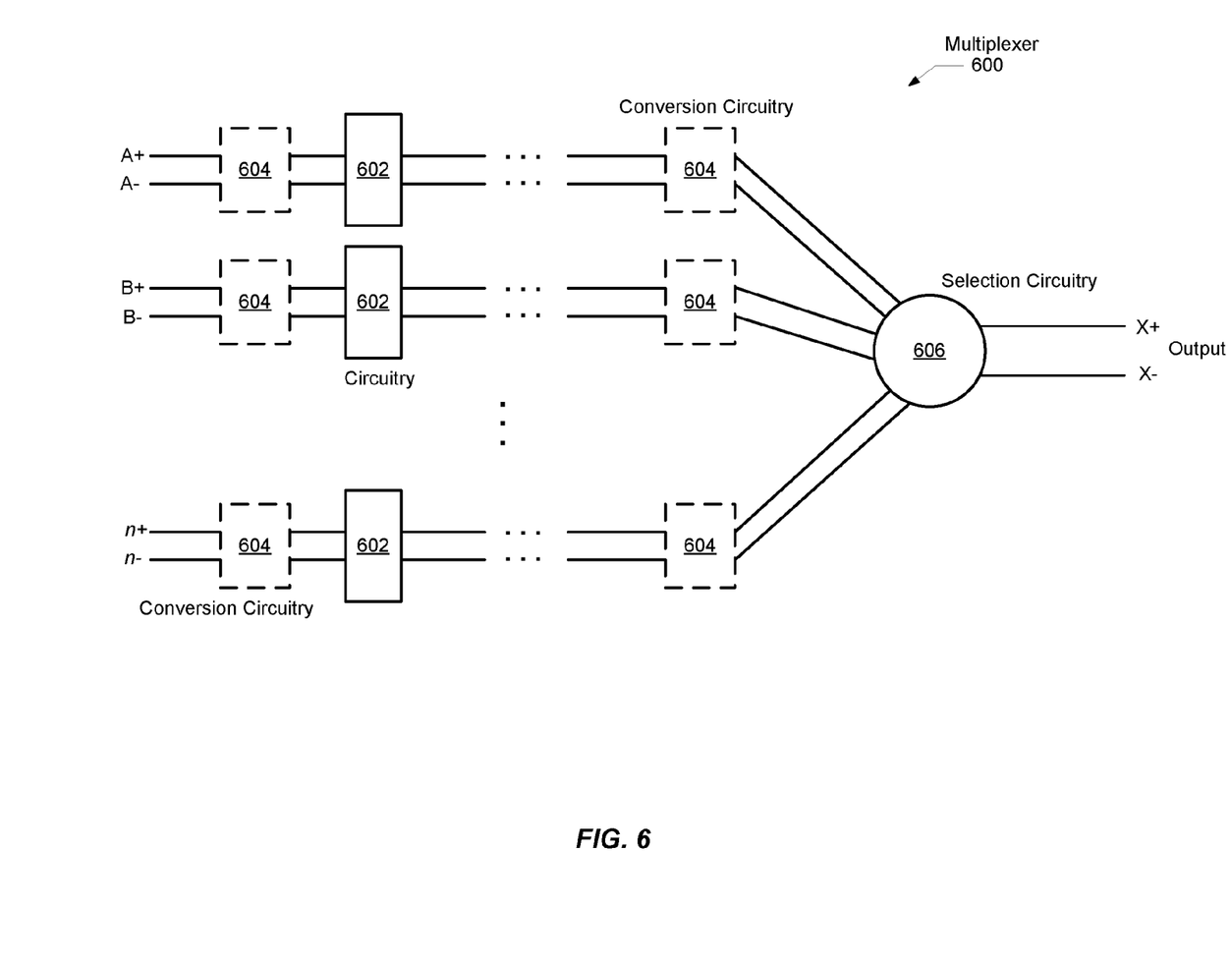
FIG. 6 is a simplified diagram of a multiplexer according to another implementation.

That is, the point(s) at which the conversion from differential to common mode takes place may vary depending on the implementation. This may be understood with reference to the diagram of FIG. 6 in which multiplexer 600 includes multiple stages that include circuitry 602 such as, for example, buffers, equalizers, amplifiers, etc. As represented by the instances of conversion circuitry 604 in dashed lines, the conversion to common mode signals may take place at various points along the signal paths associated with each multiplexer input; from the inverting and non-inverting input nodes of the multiplexer input, up to selection circuitry 606 at which the various signal paths (including the active signal path) converge. Implementations are even contemplated in which the conversion from differential signals to common mode signals may occur at multiple points within each signal path.

Figure 7:
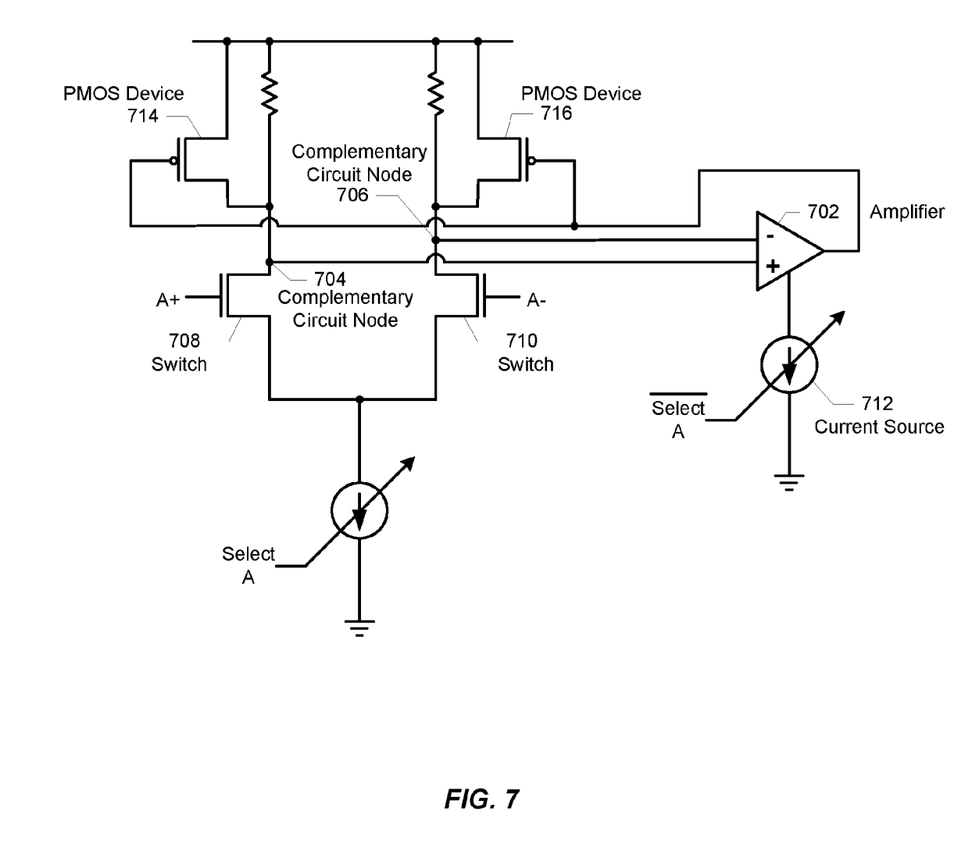
FIG. 7 is a simplified schematic of a portion of a multiplexer according to another implementation.

Implementations are also contemplated in which mechanisms other than just passive switches may be used to convert differential signals to common mode signals. That is, for example, while conversion circuitry enabled by the present disclosure (e.g., 402, 404, or 604) may be implemented as simple passive switches, such circuitry might also be implemented using one or more active devices. Such active device(s) might have a high input impedance and be configured to effect the conversion by combining complementary signals in the corresponding signal path when that path is unselected. According to one example of such an implementation illustrated in FIG. 7, this may be achieved using an analog amplifier 702 with its inputs connected to complementary nodes 704 and 706 in the depicted differential signal path following input switches 708 and 710. As discussed above, with reference to FIG. 6, this is merely one example of the point in the differential signal path at which the conversion may take place. When the depicted signal path is not selected, amplifier 702 is turned on (e.g., via current source 712), amplifying any differential voltage between nodes 704 and 706, thereby turning on PMOS devices 714 and 716. This effectively shorts nodes 704 and 706 (via the power supply rail), converting the differential signal to a common mode signal. As illustrated, combinations of active and passive circuitry may be used in the same implementation. As should be appreciated by those of skill in the art, a wide variety of active and passive devices and combinations thereof may be employed to convert differential signals to common mode signals in unselected multiplexer signal paths to reduce crosstalk.

Implementations of multiplexers enabled by the present disclosure may be employed in a wide variety of applications. One class of implementations is employed to enable high speed serial data links by which multiple devices may be connected to and communicate with one or more devices. As will be appreciated, such data links may be implemented in accordance with any of a number of serial data protocols including, for example, the DisplayPort protocol, the High-Definition Multimedia Interface (HDMI) protocol, the Serial ATA protocol, the Peripheral Component Interconnect Express (PCI-E) protocol, the Universal Serial Bus (USB) protocol, the Hypertransport protocol, Infiniband protocol, the XAUI protocol, the Ethernet protocol, any of the various versions of the foregoing, any of a variety of proprietary serial protocols, and the like. Additional applications for which implementations enabled by the present disclosure are suited include Serial Attached SCSI (SAS) and Thunderbolt, among others.

Multiplexers enabled by the present disclosure may be implemented as standalone devices as well as integrated with larger devices or systems. For example, such multiplexers may be used to implement serial interfaces (cables, connectors, etc.) in which one device communicates with multiple connected devices via a single protocol, e.g., USB 3.1, DisplayPort 1.3, etc. They may also be used to implement serial interfaces that handle multiple protocols, e.g., USB Type C connectors which handle USB communications as well as communications according to one or more additional serial data protocols such as, for example, DisplayPort, PCI-E, and Base-T Ethernet. Multiplexers enabled by the present disclosure may also be used to implement a variety of multi-protocol devices such as, for example, protocol converters that connect one or more host ports to multiple target ports (e.g., SAS to SATA), or multi-protocol controllers that connect one or more hosts to one or more multiple devices (e.g., PCI-E to SAS/SATA).

Various implementations described herein may be implemented using any of a variety of standard or proprietary CMOS processes. In addition, it should be noted that implementations are contemplated that may employ a wide range of semiconductor materials and manufacturing processes including, for example, GaAs, SiGe, etc. Multiplexers implemented as described herein may be represented (without limitation) in software (object code or machine code in non-transitory computer-readable media), in varying stages of compilation, as one or more netlists (e.g., a SPICE netlist), in a simulation language, in a hardware description language (e.g., Verilog, VHDL), by a set of semiconductor processing masks, and as partially or completely realized semiconductor devices (e.g., an ASIC). Some implementations may be a standalone integrated circuit, while others may be embedded as part of larger system on a chip.

It will be understood by those skilled in the art that changes in the form and details of the implementations described herein may be made without departing from the scope of this disclosure. In addition, although various advantages, aspects, and objects have been described with reference to various implementations, the scope of this disclosure should not be limited by reference to such advantages, aspects, and objects. Rather, the scope of this disclosure should be determined with reference to the appended claims.

What is claimed is:

1. A multiplexer, comprising:
a plurality of multiplexer inputs, each of the multiplexer inputs being a differential input;
a multiplexer output, the multiplexer output being a differential output;
selection circuitry configured to enable an active signal path from a selected one of the multiplexer inputs to the multiplexer output, the selection circuitry also being configured to disable unselected signal paths corresponding to unselected ones of the multiplexer inputs; and
conversion circuitry comprising a plurality of analog amplifiers, each analog amplifier having a high input impedance and being configured to amplify a differential voltage between complementary signals of a corresponding one of the multiplexer inputs for a corresponding one of the unselected signal paths, the conversion circuitry being configured to use the amplified differential voltage to convert, for each of the unselected signal paths, a corresponding differential signal to a common mode signal,
wherein the selection circuitry is configured to reject the common mode signal.

2. The multiplexer of claim 1, wherein the conversion circuitry further comprises a plurality of switches, each of the switches being configured to convert the differential signal for a corresponding one of the unselected signal paths by connecting complementary circuit nodes of the corresponding unselected signal path to a power supply rail.

3. The multiplexer of claim 2, wherein each of the multiplexer inputs has an inverting node and a non-inverting node, and wherein the complementary circuit nodes of each unselected signal path correspond to the inverting and non-inverting nodes of the corresponding multiplexer input.

4. The multiplexer of claim 2, wherein each of the multiplexer inputs has an inverting node and a non-inverting node, and wherein the complementary circuit nodes of each unselected signal path correspond to internal circuit nodes of the multiplexer subsequent to the inverting and non-inverting nodes of the corresponding multiplexer input and before the selection circuitry.

5. The multiplexer of claim 1, further comprising a plurality of isolation circuits, each isolation circuit being associated with a corresponding one of the signal paths and being configured to isolate the corresponding multiplexer input from the common mode signal.

6. The multiplexer of claim 1, wherein the multiplexer is an active multiplexer or a passive multiplexer.

7. A device configured to connect one or more host devices with a plurality of target devices, the device comprising one or more instances of the multiplexer of claim 1.

8. The device of claim 7, wherein the device is a serial data interface configured to transmit communications among the host and target devices using a single serial data protocol.

9. The device of claim 7, wherein the device is a serial data interface configured to transmit communications among the host and target devices using multiple serial data protocols.

10. The device of claim 7, wherein the device is a controller configured to communicate with the host and target devices using multiple serial data protocols.

11. The device of claim 7, wherein the device is a converter configured to convert communications among the host and target devices between first and second serial data protocols.

12. A multiplexer, comprising:
- a plurality of multiplexer inputs, each of the multiplexer inputs being a differential input;
- a multiplexer output, the multiplexer output being a differential output;
- selection circuitry configured to enable an active signal path from a selected one of the multiplexer inputs to the multiplexer output, the selection circuitry also being configured to disable unselected signal paths corresponding to unselected ones of the multiplexer inputs; and
- a plurality of active devices, each of the active devices having a high input impedance and being configured to combine complementary signals on complementary circuit nodes of a corresponding one of the unselected signal paths resulting in a common mode signal,
- wherein the selection circuitry is configured to reject the common mode signal.

13. The multiplexer of claim 12, wherein each of the multiplexer inputs has an inverting node and a non-inverting node, and wherein the complementary circuit nodes of each unselected signal path correspond to the inverting and non-inverting nodes of the corresponding multiplexer input.

14. The multiplexer of claim 12, wherein each of the multiplexer inputs has an inverting node and a non-inverting node, and wherein the complementary circuit nodes of each unselected signal path correspond to internal circuit nodes of the multiplexer subsequent to the inverting and non-inverting nodes of the corresponding multiplexer input and before the selection circuitry.

15. The multiplexer of claim 12, wherein each of the active devices comprises an analog amplifier configured to be bypassed or disabled when the corresponding multiplexer input is the selected multiplexer input.

16. A multiplexer, comprising:
- a plurality of multiplexer inputs, each of the multiplexer inputs being a differential input and being configured to impedance match with terminating impedance circuitry;
- a multiplexer output, the multiplexer output being a differential output;
- selection circuitry configured to enable an active signal path from a selected one of the multiplexer inputs to the multiplexer output, the selection circuitry also being configured to disable unselected signal paths corresponding to unselected ones of the multiplexer inputs;
- a plurality of switches, each of the switches being configured to connect complementary circuit nodes of a corresponding one of the unselected signal paths resulting in a common mode signal; and
- a plurality of isolation circuits, each isolation circuit being associated with a corresponding one of the signal paths being configured to isolate the corresponding multiplexer input from the common mode signal, and including a plurality of transmission gates,
- wherein the selection circuitry is configured to reject the common mode signal.

17. The multiplexer of claim 16, wherein each of the multiplexer inputs has an inverting node and a non-inverting node, and wherein the complementary circuit nodes of each unselected signal path correspond to the inverting and non-inverting nodes of the corresponding multiplexer input.

18. The multiplexer of claim 16, wherein each of the multiplexer inputs has an inverting node and a non-inverting node, and wherein the complementary circuit nodes of each unselected signal path correspond to internal circuit nodes of the multiplexer subsequent to the inverting and non-inverting nodes of the corresponding multiplexer input and before the selection circuitry.

19. A device configured to connect one or more host devices with a plurality of target devices, the device comprising one or more instances of the multiplexer of claim 12.

20. The device of claim 19, wherein the device is a serial data interface configured to transmit communications among the host and target devices using a single serial data protocol.

21. The device of claim 19, wherein the device is a serial data interface configured to transmit communications among the host and target devices using multiple serial data protocols.

22. The device of claim 19, wherein the device is a controller configured to communicate with the host and target devices using multiple serial data protocols.

23. The device of claim 19, wherein the device is a converter configured to convert communications among the host and target devices between first and second serial data protocols.

24. A device configured to connect one or more host devices with a plurality of target devices, the device comprising one or more instances of the multiplexer of claim 16.

25. The device of claim 24, wherein the device is a serial data interface configured to transmit communications among the host and target devices using a single serial data protocol.

26. The device of claim 24, wherein the device is a serial data interface configured to transmit communications among the host and target devices using multiple serial data protocols.

27. The device of claim 24, wherein the device is a controller configured to communicate with the host and target devices using multiple serial data protocols.

28. The device of claim 24, wherein the device is a converter configured to convert communications among the host and target devices between first and second serial data protocols.

* * * * *